United States Patent [19]
Tailliet et al.

[11] Patent Number: 4,897,757
[45] Date of Patent: Jan. 30, 1990

[54] PROTECTION STRUCTURE FOR AN INTEGRATED CIRCUIT

[75] Inventors: Francois Tailliet, Epinay/Seine; Jean-Marie Gaultier, Rousset Sur Arc, both of France

[73] Assignee: SGS-Thomson Microelectronics S.A., Gentilly, France

[21] Appl. No.: 283,781

[22] Filed: Dec. 6, 1988

[30] Foreign Application Priority Data

Dec. 14, 1987 [FR] France ............................ 87 17781

[51] Int. Cl.$^4$ ............................................ H02H 3/20
[52] U.S. Cl. ...................................... 361/91; 361/56; 357/23.13; 357/13
[58] Field of Search ................ 361/56, 91, 111, 117, 361/118; 357/23.13, 13, 20, 34, 35, 48

[56] References Cited

U.S. PATENT DOCUMENTS

| | | | |
|---|---|---|---|
| 3,201,682 | 8/1965 | Johnson | 307/296.6 |
| 3,787,717 | 1/1974 | Fischer et al. | 307/303 |
| 4,405,933 | 9/1983 | Avery | 357/17 |
| 4,456,939 | 6/1984 | Ozaki et al. | 361/91 X |
| 4,527,213 | 7/1985 | Ariizumi | 361/56 |
| 4,802,054 | 1/1989 | Yu et al. | 361/91 |

FOREIGN PATENT DOCUMENTS

| | | |
|---|---|---|
| 2257846 | 6/1973 | Fed. Rep. of Germany . |
| 363829 | 5/1987 | Fed. Rep. of Germany . |
| 2092379 | 8/1982 | United Kingdom . |

Primary Examiner—Derek S. Jennings
Attorney, Agent, or Firm—Lowe, Price, LeBlanc, Becker & Shur

[57] ABSTRACT

In the substrate (23) of an integrated circuit, around a pad area, a first region (24) of the first conductivity type having a high doping level in turn formed in a second region (25) of the second conductivity type and, beyond the first region with respect to the pad, a third region (26) of the second conductivity type at least partially in contact with the second region, are formed. The pad metallization (20) also establishes a contact with a portion (27) of the first region surface. A second metallization (30) connects the first region to the third one at such a location that the current path between, on the one hand, the contact area between the pad metallization and the first region and, on the other hand, the area where the third region forms a junction with the substrate (corresponding to an avalanche diode) follows a resistive path in at least one of the first or third regions.

3 Claims, 5 Drawing Sheets

PROTECTION STRUCTURE FOR AN INTEGRATED CIRCUIT

BACKGROUND OF THE INVENTION

The instant invention relates to a protection structure for components of an integrated circuit connected to a pad. More particularly, the instant invention provides for such a structure exhibiting a negative resistance, that is, which is triggered at a first overvoltage value and which afterwards permits the overcurrent to flow under a second voltage having a lower value.

FIGS. 1A, 1B and 1C respectively show a section view, a top view and an equivalent circuit diagram of a conventional integrated circuit protection against overvoltages. FIG. 1A is a section view according to line A—A of FIG. 1B.

One can see in FIG. 1A an integrated circuit contact pad constituted for example by a metallization 1 formed on a polycrystalline silicon layer 2 and insulated from a monocrystalline silicon substrate 3 by an oxide layer 4. This pad is in contact through an opening 5 with a highly doped region 6 according to the conductivity type opposite to that of the substrate, for example N+ if the substrate is of the P−-type. Another metallization 7 is in contact through another opening 8 with another N+-type region 9 in register with region 6 as it clearly appears from the top view of FIG. 1B. Thus, there is between the pad metallization 1 and the metallization 7 connected to the reference voltage a double avalanche diode, the breakdown voltage of which is determined by the doping levels of the N+ and P− areas.

FIG. 1B shows, with the same references as in FIG. 1A, a top view of the structure. It is further to be noted that the N+-type doped region 6 connected to the pad extends toward another metallization 10 which is in turn connected to the integrated circuit access with which it is desirable that the pad 1 establishes a contact and which is to be protected from overvoltages.

The equivalent circuit diagram of this structure is illustrated in FIG. 1C. The pad 1 is connected to the metallization 10 through a resistor R corresponding to the resistor of the extended portion of region 6 and this pad is connected to a reference voltage, usually the ground, through a double avalanche diode D corresponding to the N+P−N+ structure.

This device satisfactorily operates but presents the drawback that the pad voltage is limited during an overvoltage to the voltage value of the double avalanche diode which in turn has to be higher than the normal operating values of the voltages applied to the circuit. Therefore, a damaging energy dissipation occurs in the region corresponding to the double avalanche diode, giving rise to an overheating of the circuit. Indeed, the dissipated energy is equal to the avalanche voltage value multiplied by the current flowing through the protection device. If this voltage value is reduced, the energy dissipation in the substrate will be lower, the dissipated current being roughly always the same.

SUMMARY OF THE INVENTION

An object of the instant invention is to provide for a negative resistance protection structure, which is triggered at a given avalanche diode threshold but which afterwards permits to drop the voltage to a lower value.

Another object of the instant invention is to provide for a particularly simple structure for implementing such a function.

In order to attain this object and others, the instant invention provides for a protection structure for an integrated circuit connected to a pad liable to receive overvoltages, the integrated circuit being formed in a substrate of a first conductivity type having a low doping level, this substrate being connected to a reference voltage, comprising in the substrate around the pad area, according to a configuration surrounding at least partially this pad area, a first region of the first conductivity type having a high doping level, in turn formed in a second region of the second conductivity type and, beyond the first region with respect to the pad, a third region of the second conductivity type at least partially in contact with the second region; the pad metallization also establishes a contact with a portion of the first region surface and a second metallization connects the first region to the third one at such a location that the current path between, on the one hand, the contact are between the pad metallization and the first region and, on the other hand, the area where the third region forms a junction with the substrate (corresponding to an avalanche diode), follows a resistive path in at least one of the first or third region.

According to another aspect of the invention, one has provided for an IC protection circuit connected to a pad liable to receive overvoltages wherein the pad is connected to a reference voltage through a first path comprising a transistor and through a second path comprising a resistor in series with an avalanche diode and wherein the transistor base and the junction point of the resistor and of the avalanche diode are interconnected to the integrated circuit (IC) to be protected.

BRIEF DESCRIPTION OF THE DRAWINGS

Those objects, features, advantages and others of the instant invention will clearly appear from the following detailed description of preferred embodiments, in connection with the attached drawings wherein.

DETAILED DESCRIPTION OF THE DRAWINGS

Figure 1A:
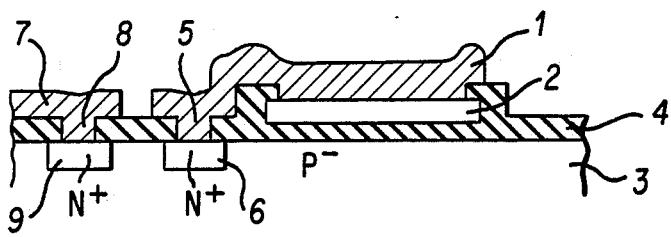
FIGS. 1A, 1B, 1C and 1D, hereinabove described, respectively show a section view, a top view, an equivalent circuit diagram and an operating curve of a protection structure according to the prior art.
Figure 1B:
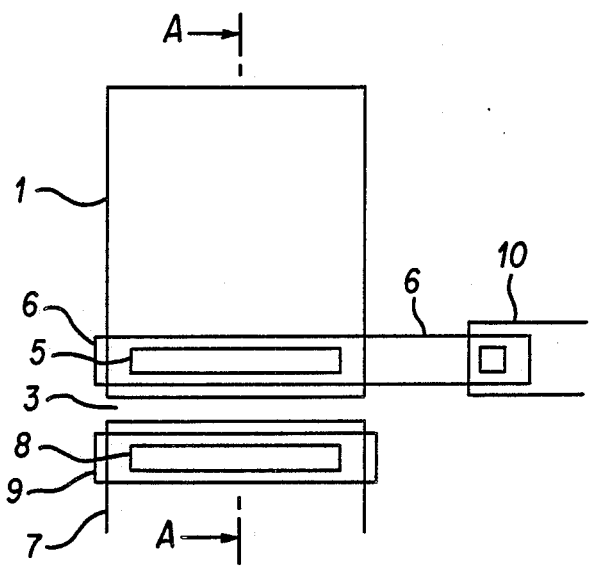
Figure 1C:
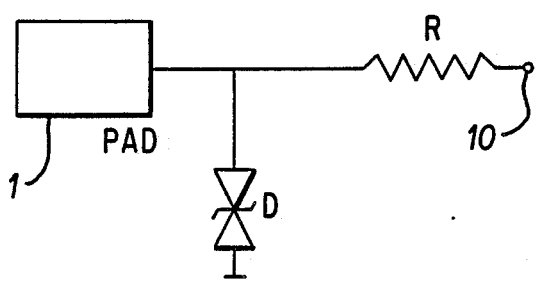
Figure 1D:
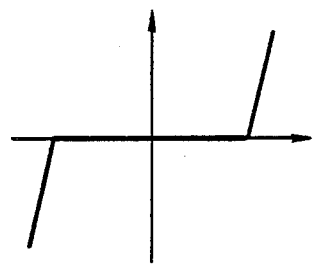
Figure 2A:
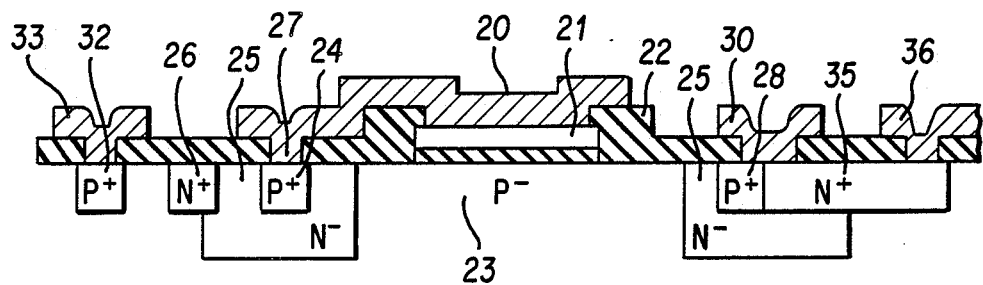
FIGS. 2A, 2B, 2C and 2D respectively show a section view, a top view, an equivalent circuit diagram and an operating curve of a protection structure according to a first embodiment of the instant invention.
Figure 2C:
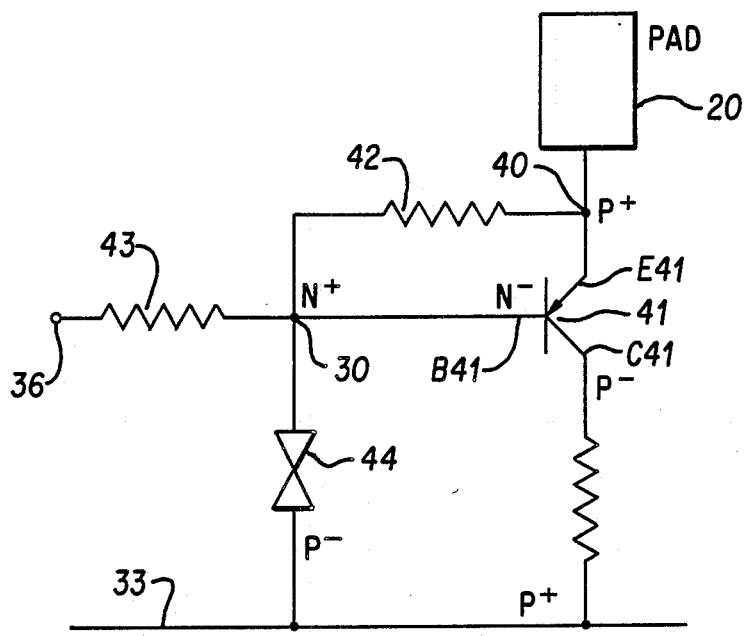
Figure 2D:
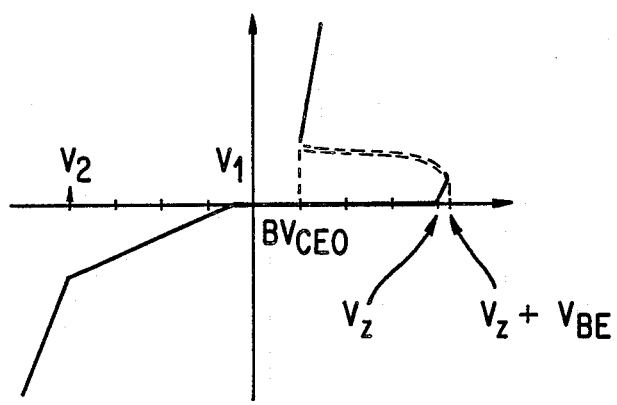
Figure 2B:
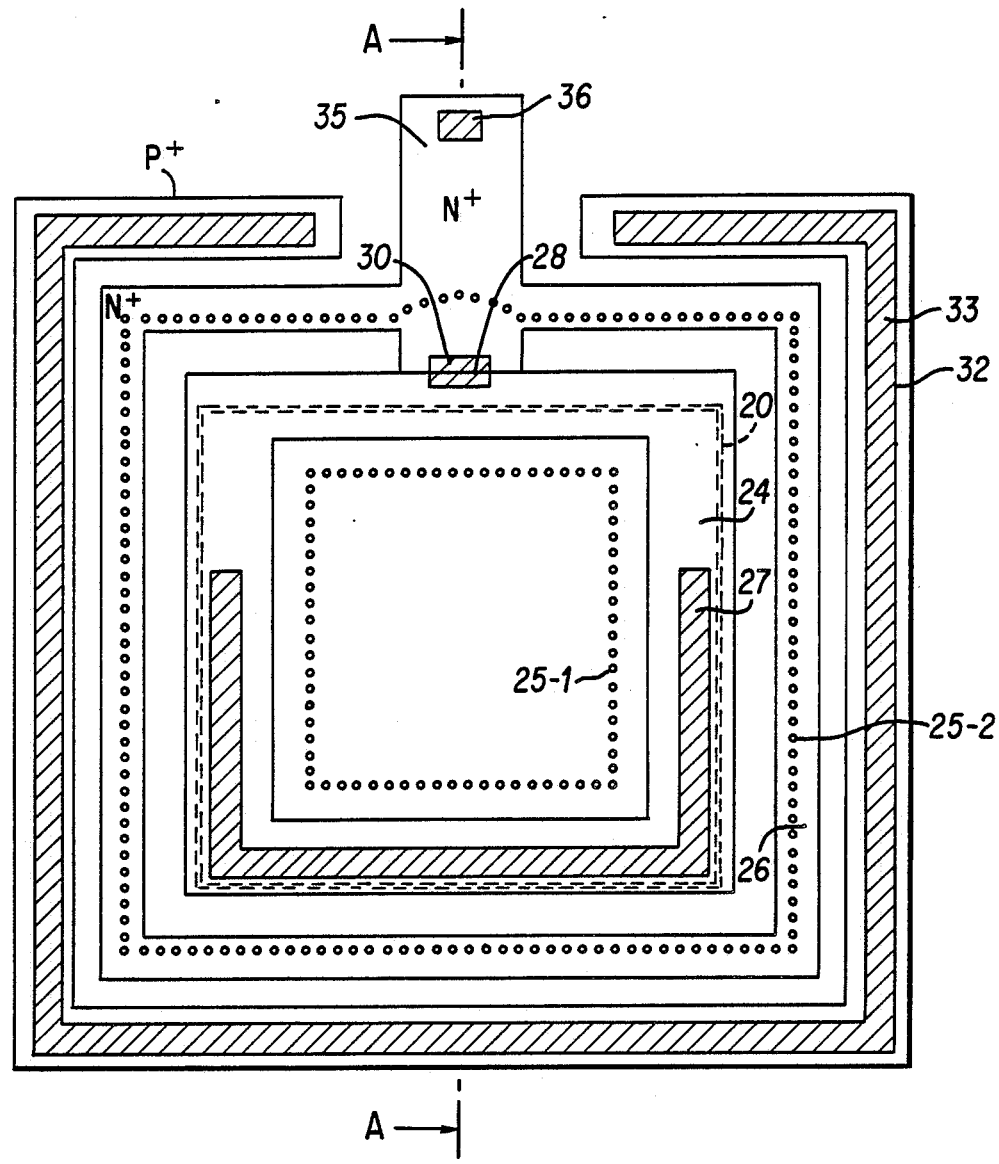

FIGS. 2A and 2B which will be simultaneously referred to hereinafter respectively show a section view and a schematic top view of a first embodiment of the instant invention, the section view of FIG. 2A being drawn according to the line A—A of FIG. 2B.

The pad metallization 20 is shown as formed over a polycrystalline silicon layer 21 (not shown on the top view of FIG. 2B) and an insulating layer 22, usually silicon oxide, on top of a monocrystalline silicon substrate 23. The metallization outline is designated by the dotted line 20 of FIG. 2B. This metallization is in contact, through an opening 27, with a portion of a P+-type region 24. This region 24 is in turn formed in a N⁻-type region 25, the limits of which are designated in FIG. 2B by a series of small circles referenced 25-1 and 25-2. A second ring-shaped region 26 of the N+-type surrounds the first ring-shaped region 24 and is spaced apart therefrom by a generally constant width 25 of the N⁻-type, except for a location 28 where the ring-shaped regions of the P+- and N+-type are locally adjacent. The upper surface of the junction area 28 between the regions 24 and 26 is shorted through a metallization 30, only the contact opening, also referenced 30, being illustrated in FIG. 2B.

The whole structure is surrounded with a P+-type doped ring 32 coated with a metallization 33 permitting to ensure the biasing of the semiconductor substrate. The N+-type region 26 comprises an extension 35 to which a metallization 36 is connected, only the contact opening of which is shown in FIG. 2B.

The structure illustrated in FIGS. 2A and 2B corresponds to the equivalent circuit diagram of FIG. 2C. This drawing again shows the pad 20, a terminal connected to the circuit to be protected corresponding to the metallization 36, a ground terminal corresponding to the metallization 33 and a connection point corresponding to the metallization 30.

The area where the pad 20 is in contact with the P+-type ring 24 is referenced 40. This point 40 is shown as being connected to the emitter E41 of a transistor 41, this emitter corresponding to the P+ region 24. The base B41 corresponds to the N⁻ region 25 and the collector C41 corresponds to the P⁻ substrate region and is grounded through a resistor which corresponds to the path in the P⁻ area towards the P+-type diffused region 32 and the metallization 33. On the other hand, the point 40 is connected to a resistor 42 which corresponds to the path in the P+ region between the contact 27 with the pad metallization and the connection point 30 which corresponds to the shorted area 28 between this P+ region and the N+ region 35. Thus, the metallization 30 is connected to the output metallization 36 through a resistor 43 corresponding to the path in the N+ region 35. Lastly, the metallization 30 is connected through an avalanche diode 44, the anode of which corresponds to the N+ region 35 and the cathode to the P⁻ substrate region which is connected, by a sheet resistor not shown, to the P+ region 32 and to the metallization 33.

The circuit operation will be disclosed in relation with FIG. 2D which shows the current-voltage characteristic between the pad and the reference voltage terminal.

In case of application of a positive overvoltage onto pad 20 and onto point 40, when this overvoltage reaches at point 30 the breakdown value $V_Z$ of the diode 44, the voltage rise is limited and the current starts flowing through the avalanche diode 44. Very rapidly, this current flow causes the voltage drop across resistor 42 to overcome the direct conduction voltage $V_{BE}$ of the emitter-base junction of transistor 41; this transistor therefore becomes conductive and the current instead of flowing through the avalanche diode 44 flows from the emitter towards the collector of transistor 41. Thus, as shown in the figure, the voltage at point 40 drops to the value $BV_{CEO}$ of this transistor. In order to give an order of magnitude, the voltage $V_Z$ will typically be of about 20 volts while the voltage $BV_{CEO}$ will typically be of about a few volts, for example 5 volts. It is therefore possible to drain off the overcurrent under a low voltage when an overvoltage occurs, which entails a low energy consumption in the semiconductor substrate. On the other hand, the device is triggered only at a value relatively higher than the avalanche voltage of diode 44 and does not impair the proper operation of the circuit.

In case of application of a negative overvoltage onto the pad 20, as soon as a value V1 corresponding to the direct voltage drop of the avalanche diode 44 is reached, for example 1 volt, said diode gets conductive. Then, the current flows through the resistor 42 and the voltage drop across this resistor increases to a value V2−V1 corresponding to the reverse avalanche voltage of the base-emitter junction of transistor 41, that is, also a value of about 20 volts corresponding to the reverse breakdown voltage of the junction P+N⁻ between the regions 24 and 25. Thus, as far as this reverse operation is concerned, one obtains an operation roughly analog to that of the prior art when the overvoltage has reached a high level, but with the advantage that the conduction starts earlier, as soon as the value V1 is reached. This voltage V1 has a low value but this is not a drawback in case of reverse overvoltages since the pad 20 is designed to receive positive voltages only and therefore any negative voltage corresponds to spurious pulses.

FIGS. 3A, 3B, 3C and 3D respectively show a section view, a top view, an equivalent circuit diagram and an operating curve of an alternative embodiment of the instant invention. The section view of FIG. 3A corresponds to the dotted line designated by A—A in FIG. 3B.

Figure 3A:
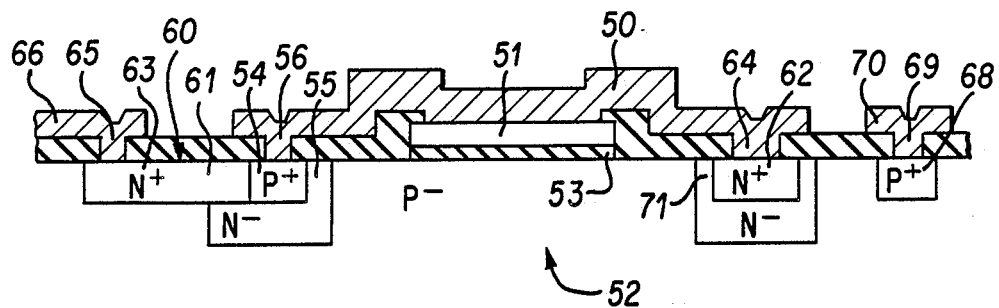
FIGS. 3A, 3B, 3C and 3D respectively show a section view, a top view, an equivalent circuit diagram and an operating curve of a protection structure according to a second embodiment of the instant invention.
Figure 3C:
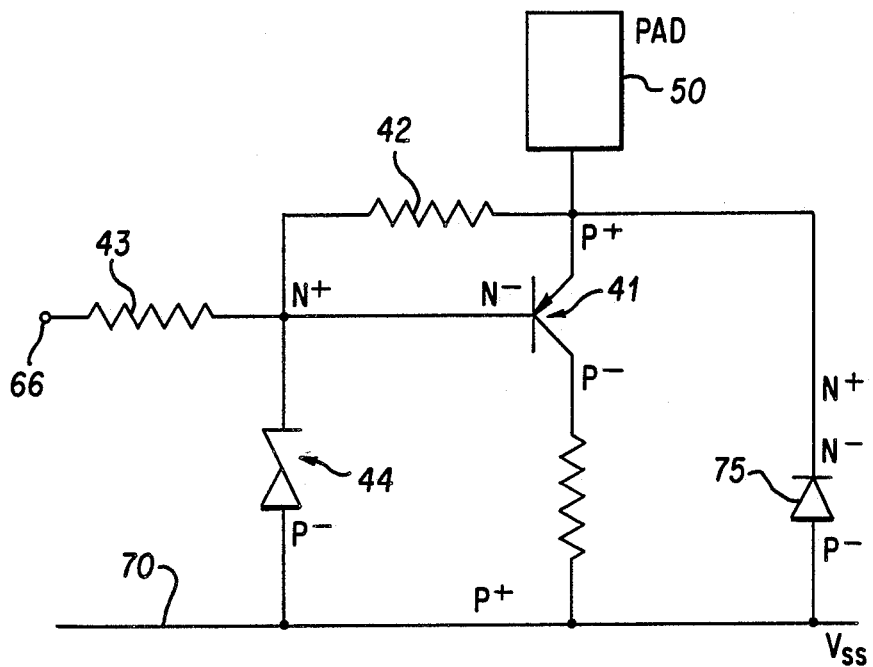
Figure 3B:
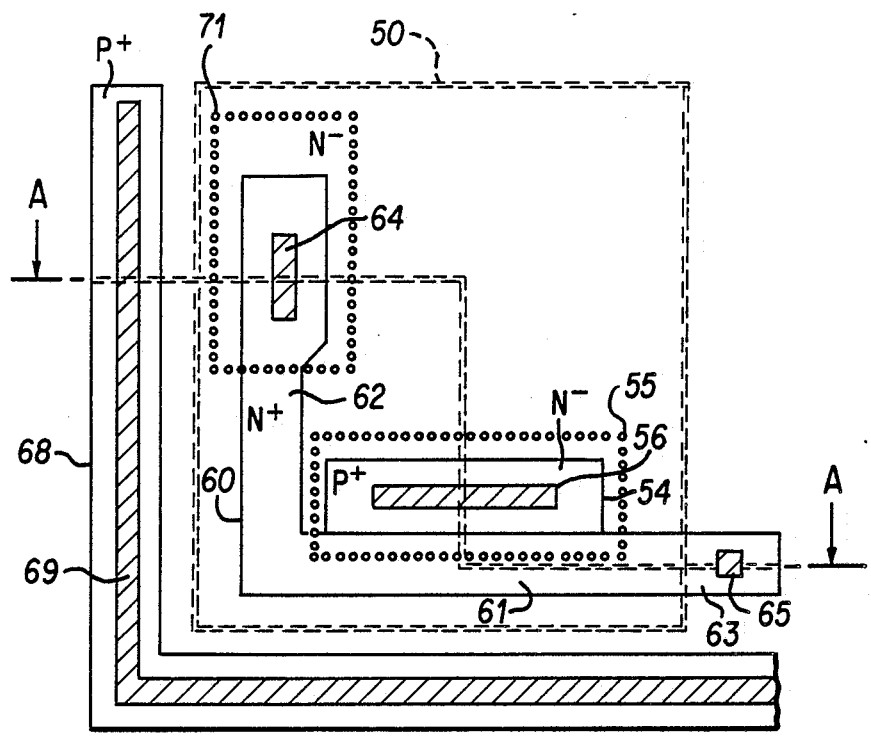

Generally, referring to FIG. 3B, it will be noted that the structure, instead of being a structure wherein the various regions are ring-shaped, is a structure wherein the various regions are positioned along one or two edges of the pad area. Such a structure could also be implemented in the embodiment according to FIG. 1.

Referring to FIGS. 3A and 3B, the alternative embodiment of the invention comprises a metal pad 50 liable to receive overvoltages, shown as in case of FIG. 2A on a polycrystalline silicon area 51 insulated from a substrate 52 by means of an insulating layer 53, usually silicon oxide. As for FIG. 2B, FIG. 3B does not show the polycrystalline silicon area 51 and the metallization outline 50 is designated by a dotted line. The metallization 50 is in contact with a P+-type diffused region 54 formed in a N⁻ diffused region 55. It can be seen in FIG. 3B that the diffused region 54 and the region 55 into which it is buried substantially extend along one edge of the pad 50. A contact area 56 is provided for between the P+-type region 54 and the pad metallization 50.

The P+-type region 54 is in contact substantially along its whole length with a N+-type region 60 wherein three parts can be differentiated: a part 61 which is precisely the part in contact with this P+-type region, a part 62 which extends perpendicularly to the first one along another edge of the pad and a part 63 which extends from part 61. The part 62 of the N+ region 60 comprises at its extremity a contact area 64 with the pad metallization 50. The extension 63 of the N+-type region 60 comprises a contact area 65 connected to a metallization 66 near the integrated circuit access to be protected.

Moreover, a P+-type region 68 connected to a substrate metallization 70 by means of a contact area 69 is represented. Usually, this metallization is connected to a reference voltage such as the ground. It will be further noted that the part of the portion 62 of the N+-type region 60, on which the contact 64 is formed, is buried into a N−-type diffused area 71. As in the example of FIG. 2B, FIG. 3B shows the boundaries of the N−-type areas 55 and 71 by a series of small circles.

The operation of the structure of FIGS. 3A and 3B will be explained in relation with FIG. 3C. In this figure, the pad 50, the substrate metallization 70 and the integrated circuit access metallization 66 can be seen. This figure again shows the transistor 41 and the avalanche diode 44 in FIG. 3C. As previously, the emitter of transistor 41 corresponds to the P+ region 54 connected to the pad 50, its base corresponds to the N− region 55 and its collector corresponds to the P−-type substrate region 52, in turn connected to the reference metallization 70 by the P+-type region 68.

The avalanche diode 44 corresponds to the junction between the P−-type substrate and the part of N+-type region 60 which is not buried into the N−-type area 55 or the N−-type area 62. It will be noted that there is a connection, at the neighbourhood of part 61 between this N+ region and the N−-type region 55 corresponding to the base of transistor 41. The resistor 42 between the cathode corresponding to the N+ region 60 of the avalanche diode and the contact area between the P+ region and the pad is ensured by the inner resistor of region 60 between the contact region 64 of the N+-type layer 62 with the pad 50 and the region of this area 60 where the avalanche diode is positioned. Thus, contrarily to the example of the preceding figure, the resistor 42 is formed in a N+-type region instead of a P+-type region. However, its effect remains the same. Moreover, since, contrarily to the first embodiment, the N+-type region 62 is connected to the pad metallization 50, there is a diode P+P−(N−)N+ between the metallization 70, the region 68, the region 52, the region 71, the region 62 and the metallization 50. This diode is labelled 75 in FIG. 3C.

Figure 3D:
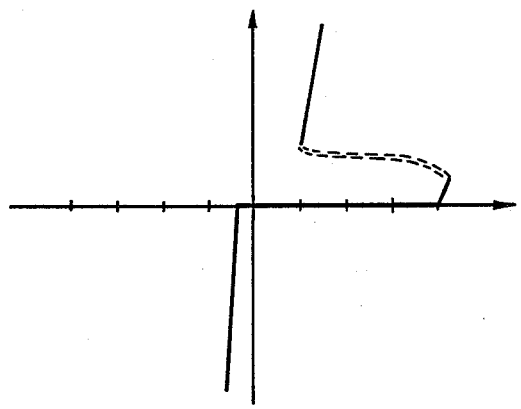

The current-voltage characteristic curve of this circuit is illustrated in FIG. 3D. In case of a positive polarity overvoltage pulse, the operation is the same as in case of FIG. 2D. But, in case of a negative pulse, this one is absorbed by diode 75.

It will be noted that the negative polarity operation mode corresponding to FIG. 2D permits to avoid the well known latch-up problem inherent to the CMOS circuits and avoid reaching a destructive threshold.

We claim:

1. A protection structure for an integrated circuit connected to a pad liable to receive overvoltages, the integrated circuit being formed in a substrate (23; 52) of a first conductivity type having a low doping level, this substrate being connected to a reference voltage, comprising, in the substrate, around the pad area and according to a configuration surrounding at least partially this pad area:

a first region (24; 54) of the first conductivity type having a high doping level, in turn formed in a second region (25; 55) of the second conductivity type, and beyond the first region with respect to the pad, a third region (26; 60) of the second conductivity type partially in contact at least with the second region; and wherein:

the pad metallization (20; 50) also establishes a contact with a portion (27; 56) of the first region surface, a second metallization (30; 50) connects the first region to the third one at such a location that the current path between, on the one hand, the contact area between the pad metallization and the first region and, on the other hand, the area where the third region forms a junction with the substrate (corresponding to an avalanche diode) follows a resistive path in at least one of the first or third region.

2. A protection circuit for an integrated circuit connected to a pad liable to receive overvoltages, wherein the pad (20; 50) is connected to a reference voltage (33; 70) through a first path comprising a transistor (41) and through a second path comprising a resistor (42) in series with an avalanche diode (44), and wherein the transistor base and the junction point of said resistor and said avalanche diode are interconnected to the integrated circuit access to be protected.

3. A circuit according to claim 2, further comprising a third path comprising a forward-connected diode (75) between the reference voltage (70) and the pad (50).

* * * * *